US007941912B2

(12) United States Patent
Follmann et al.

(10) Patent No.: US 7,941,912 B2
(45) Date of Patent: May 17, 2011

(54) CLAMP BODY FOR ELECTRICAL CONNECTOR CLAMPS

(75) Inventors: Hartmut Follmann, Extertal (DE); Olaf Gemke, Steinheim (DE); Heinz Reibke, Bad Salzuflen (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 12/158,527

(22) PCT Filed: Dec. 6, 2006

(86) PCT No.: PCT/EP2006/011709
§ 371 (c)(1),
(2), (4) Date: Oct. 10, 2008

(87) PCT Pub. No.: WO2007/079846
PCT Pub. Date: Jul. 19, 2007

(65) Prior Publication Data

US 2009/0070998 A1 Mar. 19, 2009

(30) Foreign Application Priority Data

Dec. 21, 2005 (DE) ........................ 10 2005 061 732

(51) Int. Cl.
*H05K 13/04* (2006.01)

(52) U.S. Cl. .............. 29/729; 29/874; 403/362; 101/3.1

(58) Field of Classification Search .................... 29/729, 29/874; 403/362; 101/3.1
See application file for complete search history.

(56) References Cited

U.S. PATENT DOCUMENTS

| | | | | |
|---|---|---|---|---|
| 3,191,140 | A * | 6/1965 | Coldren | 439/782 |
| 3,753,640 | A * | 8/1973 | Duepree | 425/392 |
| 4,458,975 | A * | 7/1984 | Bohlin et al. | 439/811 |
| 5,996,455 | A * | 12/1999 | Haag et al. | 83/54 |

FOREIGN PATENT DOCUMENTS

| | | |
|---|---|---|
| DE | 3308568 | 9/1983 |
| DE | 3840659 | 7/1989 |
| EP | 0704931 | 4/1996 |
| FR | 2731556 | 9/1996 |
| GB | 2256096 | 11/1992 |

OTHER PUBLICATIONS

International Search Report for PCT/EP2006/011709, Apr. 16, 2007, EPO.

* cited by examiner

*Primary Examiner* — Derris H Banks
*Assistant Examiner* — Azm Parvez
(74) *Attorney, Agent, or Firm* — Bourque & Associates, P.A.

(57) ABSTRACT

In order to increase the clamping effect in an electrical screw connector used in industrial applications to fix or hold an electrical conductor, the support and contact surfaces for the electrical conductor are textured. According to the invention, the texturing of the support and contact surfaces for the electrical conductor is carried out by various production methods using embossing or stamping tools.

4 Claims, 5 Drawing Sheets

CLAMP BODY FOR ELECTRICAL CONNECTOR CLAMPS

TECHNICAL FIELD

The invention relates in general to the realm of fundamental electrical components from the world of electronic equipment consisting of electrically-conducting connector elements. One of these connector elements from the realm of connector terminals is in its simplest form the screw connector. In screw terminals, electrical conductors are brought into mutual mechanical and electrical contact in clamp bodies by means of clamp screws and suitably-shaped clamping elements.

BACKGROUND INFORMATION

In industrial connector equipment, a large number of differing clamp bodies for screw terminals have proved themselves by the billions, and are the most frequently-used connector equipment. Clamp bodies for the electrical screw terminals consist as a rule of a clamp pocket with essentially U-shaped cross section (EP 0 334 975), or an approximately rectangular housing with at least one threaded part and/or a threaded hole, into whose threads a clamping screw may be threaded. The high clamp body may also be in the shape of a pull strap. All clamp bodies have in common the fact that they include a clamp body recess, hereafter referred to as a cavity that serves to receive the electrical conductor, whereby the conductor may consist of single-wire or multiple-wire (fine wire) conductors.

The electrical conductor is clamped within this cavity by means of the clamp screw. Clamping of the electrical conductor may also be achieved by means of a current bus or rail inserted between the clamp screw and the electrical conductor. In order to increase the clamping effect of the electrical conductor, the current rail may be textured on the side facing toward the electrical conductor. Also, the floor surface of the cavity of the clamp body may be textured. So, for example, clamp bodies for electro-technical screw terminals are known from EP 0 082 285 B1 and from DE 203 05 314 that include walls projecting inward within the cavity between which recesses are located.

These clamp bodies with textured recess floors are produced, for example, from stamped plate steel or copper alloys using forming equipment. In this type of clamp body, which is formed of several pieces corresponding to the above-mentioned tasks, the cavity-plate or pocket-plate thickness selected acts disadvantageously on the deformation of the oblique floor walls during loading by the clamp screw. These deformations lead to a clear reduction of permissible clamping forces, whereby secure clamping because of the setting of the conductor connection is not ensured.

An additional embodiment example of a conventional clamp body may be taken from the State of the Art, for example from the “CLIPLINE Terminal 2002” TN12 5123461/10.04.02-00 product catalog of the company Phoenix Contact & Co. KG. The clamp bodies shown therein made of a tension-crack corrosion-resistant high-value copper alloy possess a crosswise drilled hole oblique to the floor of the cavity for optimum affixing of electrical conductors. This hole is created by a metal-cutting procedure within the clamp body, and is a penetrating hole that passes obliquely through the entire clamp body. Such an embodiment example of State-of-the-Art clamp bodies produced by means of a metal-cutting procedure may be taken from FIG. 1. The hole perpendicular to the cavity aperture is so located that the surface in the floor of the cavity, as well as adjacent oblique surfaces that represent the connection to the side walls and which normally extend flat from the one side of the cavity aperture to the other side of the cavity aperture, are interrupted by the drilled hole. This interruption serves to texture the cavity in order to increase the clamping effect between the electrical conductor and the clamp body. The drilled hole passing through the clamp body in the area of the floor surface of the cavity weakens the sidewalls of the clamp body exceedingly, i.e., the forces arising from the tension moment of the clamp screw may act disadvantageously on the geometric shape of the clamp body. The hazard of plastic deformation exists along with that of having no stable clamping action. Further, positive function upon several actuations of the screw terminal cannot be ensured. The metal-cutting processing procedure thus acts disadvantageously on the mechanical strength of the clamp body.

SUMMARY

It is therefore the task of the invention to produce a clamp body of the type mentioned at the outset such that the aforementioned disadvantages of the known configuration are avoided, and particularly, a lower-cost clamp body with simple functional geometry for electrical screw terminal is provided. Also, the manufacture of the clamp body should allow a higher output level per time unit, whereby the clamp body corresponds not only to the torque requirements of the standard, but also, because of the special manufacturing procedure, allows resistance to deformation that is greater than the standard device available on the market and is useable specifically for small clamp bodies, e.g., in row-terminal configurations for plug connectors.

This task is solved by the invention with a clamp body of the named type by the distinguishing characteristics disclosed and recited herein. In order to manufacture clamp bodies with these characteristics of the invention that achieves uniform and safely-applied clamping force, and moreover that typically are resistant to vibration under loads found in industrial applications in screw terminals for long time periods such as moving machine parts, it is proposed to use a procedure for clamp body manufacture, particularly during production of the recesses in the cavity of the clamp body, that does not reduce the resistance of the clamp body to deformation, but rather maintains or even increases it. The structuring of the surfaces within the cavity causes the values of the IEC Norm 60 947-1/EN 60 947 regarding secure connection of the conductor not merely to be fulfilled, but actually exceeded. The textured surfaces within the cavity act as support surfaces and contact surfaces for the electrical conductor.

In order to increase the strength of the clamp body and the firm seat of the electrical conductor for technical application, it is recommended by the invention to use the following manufacturing procedure in the production of textures in the form of, for example, recesses in the surfaces. Recesses that represent deepened recesses within the cavity of the clamp body for electro-technical screw terminals in floor and sidewalls. These deepened recesses that ensure the firm seat of the electrical conductor in interaction with the current rail are technically known as beads.

During production of the beads in the clamp body, one takes advantage of the properties of the material of which the clamp body consists. As a rule, the clamp bodies are of brass, but other metals such as steel are conceivable. Copper alloys may be cold-shaped, and are therefore well suited to pressing, stamping, hammering, striking, and chasing. These material properties are advantageously used during the production of the beads.

Production of the beads is by means of embossing equipment. This embossing equipment is considerably cheaper because production of the beads may be achieved within a fully-automated cycle process. The cycling process during embossing is significantly shorter with respect to the metal-cutting process. For example, the clamp bodies that have already passed through various manufacturing steps are supplied to an automatic embossing machine that may be driven mechanically and/or pneumatically. The clamp bodies are positioned exactly and automatically tensioned in a tool device. Simultaneously, a embossing tool moves horizontally into the part to be stamped and/or into the cavity of the clamp body. The clamp body may also be so supplied to the embossing tool by the automatic supply device that proper embossing position is achieved. The embossing may be, for example, made of tool steel, and may be heated. Further, the embossing tool possesses a texture on its underside whose shape and/or relief corresponds in size and shape to that of the desired beads within the clamp body. The embossing tools may be engraved on many sides and are flexibly interchangeable so that any conceivable texture may be produced on the embossing tool and embossed into the clamp body. The shape and size of the texturing of the surface of the floor and sidewalls within the cavity of the clamp body may be adapted to the technical requirements such as, for example, various clamping effects on different electrical conductors. Not only the creation of recesses in the shape of beads, but also the creation of raised projections is possible because of cold shaping in the embossing technique. For example, raised projections in the form of crowned projections or a combination of recesses and raised projections that provide optimum clamping effect on the electrical conductor used. For example, micro-textures are available for clamping fine-wire conductors in clamp bodies. I.e., the texture and shape of the support surface and contact surface for the electrical conductor within the clamp body determines the clamping effect, and thus the extraction forces on the clamped conductor.

The embossing process itself may be achieved, for example, by adding a pressure spindle vertical to the embossing stamp. This pressure needle is driven through the drilled hole of the clamp screw using pneumatically-driven reciprocation, and acts with hydraulically-generated pressure on the embossing tool. The texture of the embossing tool is thus pressed into the contacted surface of the clamp body. Next, the pressure spindle returns to its initial position, and the clamp body is ejected from the tensioning device.

A stamping machine that optimizes the cycling time of the embossing may also be advantageously used to create the embossing texture. Further, this procedure distinguishes itself by a high cycle rate, which reduces the cycling time.

BRIEF DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENTS

Reference Index List

| | |
|---|---|
| 1 | Clamp body |
| 2 | Aperture for clamp screw |
| 3 | Aperture for electrical conductor |
| 4 | Cavity |
| 5 | Floor surface |
| 6, 6 | 'oblique surface |
| 7, 7 | 'sidewall |
| 8 | Upper surface |
| 9 | Texture (within clamp body) |
| 10 | Drilled hole |
| 11 | Recess |
| 12 | Sidewalls |
| 13 | Upper wall |
| 14 | Floor surface |
| 15 | Device |
| 16 | Embossing tool |
| 17 | Embossing-stamp texture |
| 18 | Embossing position |
| 19 | Pressure spindle |
| 20 | Embossing stamp |
| 21 | Inner side 1 |
| 22 | Inner side 2 |
| 23 | Perpendicular axis |
| 24 | Inclination |
| 25 | Crown-shaped projection |
| 26 | Micro-texture |
| 27 | Contour |
| 28 | Floor thickness |
| 29 | Front face |
| 30 | Rear face |

Figure 1:
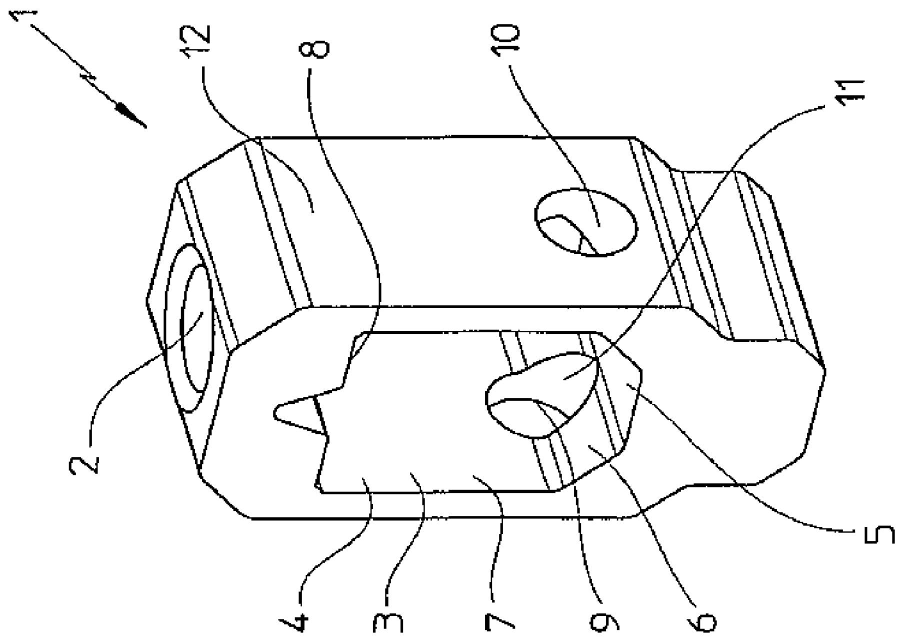
PRIOR ART Fig.1
FIG. 1 is a perspective view of a clamp body from the prior art.

A clamp body 1 known from the State of the Art is shown in FIG. 1 as an example with a first aperture 2 to receive a clamp screw (not shown) with a second aperture (3) to receive an electrical conductor (not shown) into a cavity 4 that is formed by the inner surfaces 5, 6, 7, 8. The inner surfaces 5, 6 serve the electrical conductor as support surface and contact surface. The inner surfaces 5, 6 may possess a texture 9. This texture is created through the drilled hole 10 that extends obliquely through the entire clamp body 1 and/or perpendicular through the sidewalls 12. The drilled hole 10 causes the normally two-dimensional penetrating inner surfaces 5, 6, 7 to be interrupted. The interruption forms a recess 11 caused by the drilled hole 10, for example in the oblique surface 6 that is also present in the inner sidewall surface 7 and the floor surface 5. The drilled hole 10 is a penetrating drilled hole 10 that passes through the two sidewalls 12 and the cavity 4. FIG. 1 thus shows a perspective view of a clamp body 1 that possesses inner surfaces within a cavity 4 whose textures were created by means of a metal-cutting process.

The invention relates to a procedure and a device to produce a clamp body of copper alloy for electro-technical screw terminals with textured surfaces within the cavity that serve as support surfaces for the electrical conductor, whereby the textured surfaces were created using embossing equipment.

Figure 2:
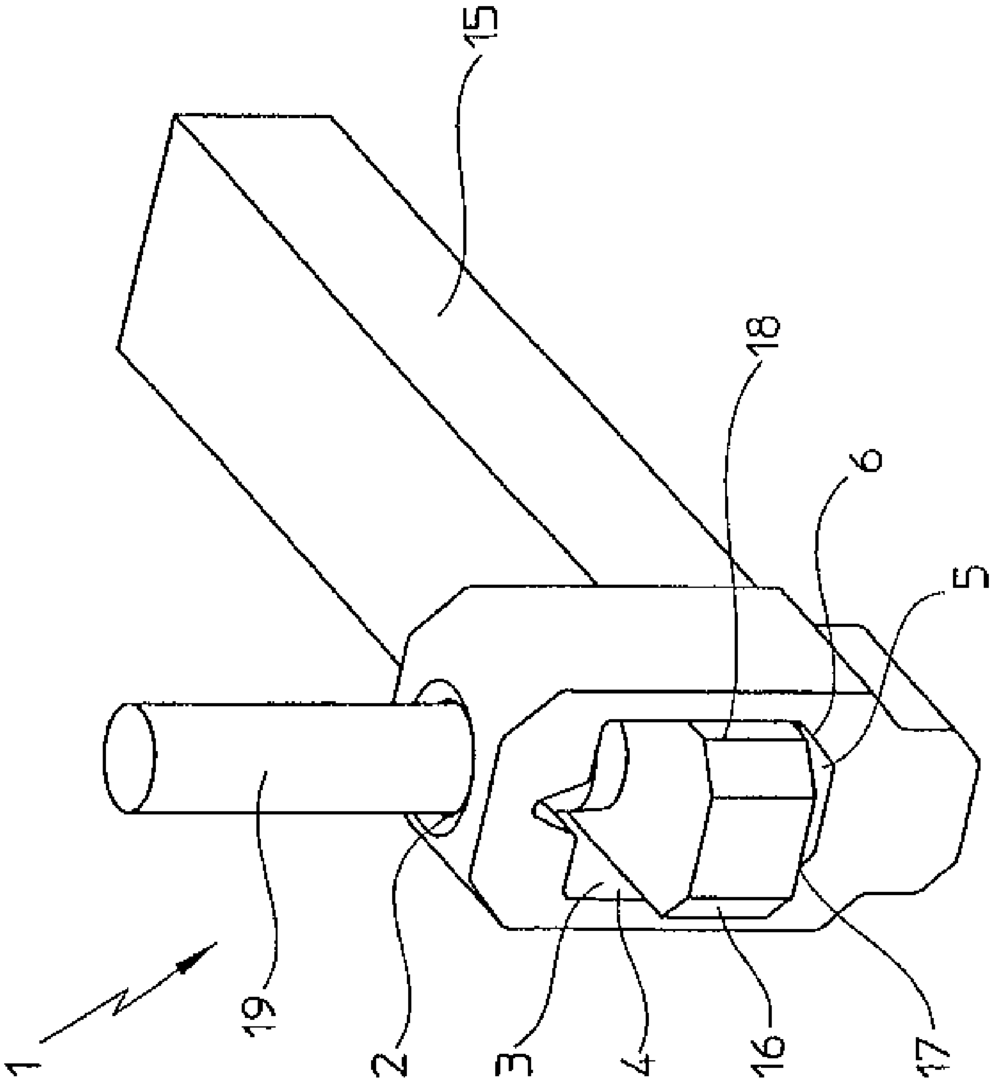
FIG. 2 is a procedure and device to produce a textured support surface for electrical conductors within a clamp body using embossing equipment.

Application of the production procedure and the device are shown as an example in FIG. 2. The device 15 consists of an embossing tool 16 located in FIG. 2 within the aperture 3 of the cavity 4 of the clamp body 1 and the embossing position 18. The embossing tool 16 possesses a texture 17 on its underside (the side facing toward the floor surface 5 of the clamp body 1). A pressure spindle 19 is located within the aperture 2 of the clamp body 1 that serves to receive the clamp screw that presses perpendicularly onto the embossing tool 16. The texture 17 contained within the embossing tool 16 is reproduced in one or more inner surfaces of the cavity 4 by means of the force transfer from the pressure spindle 19 onto the embossing tool 16. In the example of FIG. 2, into the oblique surfaces 6, 6'. The transfer of the texture 17 from the embossing tool 16 into the surfaces 6, 6 may be accomplished by means of pressing, striking, hammering, or driving. The pressure spindle 19 can thus operate on the embossing tool 16 using different techniques. After the texture 17 is transferred to the surfaces of the cavity 4, the clamp body 1 is ejected from the tensioning device (not shown). A clamp body 1 thus produced is shown in FIG. 4.

Figure 3:
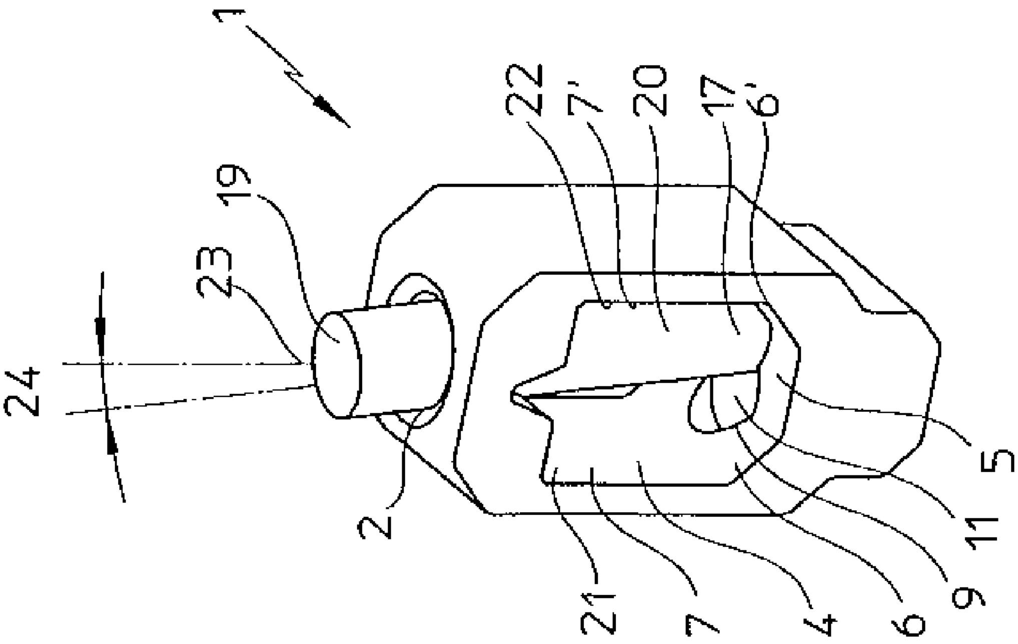
FIG. 3 procedure and device to produce a textured support surface for electrical conductors within a clamp body using impact equipment.

As FIG. 3 shows, the texturing 9 of the inner surfaces of the clamp body 1 may also be by means of impact equipment. The pressure spindle 19 is then itself the bearer of an embossing texture 17, and serves as embossing stamp 20, whereby the embossing tool 16 is not required. The embossing stamp 20 is guided through the aperture 2 and forms by means of impact equipment a deepened recess 11 on the oblique surfaces 6, 6 of the floor surface 5 and, as applicable, on the sidewall surfaces 7, 7'. For this, the clamp body 1 is positioned in a tensioning device (not shown), is inclined by a few degrees from the perpendicular axis 23 of the embossing stamp 20. The angle of inclination 24 may vary between 0° and 10°. The embossing stamp 20 may advantageously be inserted through the aperture 2 into the cavity 4 of the clamp body 1 at this angle of inclination 24 with respect to the perpendicular axis 23 of the embossing stamp 20. This angle of inclination 24 causes first the inner side(1) 21 of the cavity 4 to become textured on surfaces 5, 6, 7, and second, by pivoting the embossing stamp 20 or the tensioning device, the inner side (2) on surfaces 5, 6', 7'. During this process of texturing the inner surfaces, the material of the clamp body 1 may also be driven by moving the embossing stamp 20 from side(1) to side(2).

Figure 4:
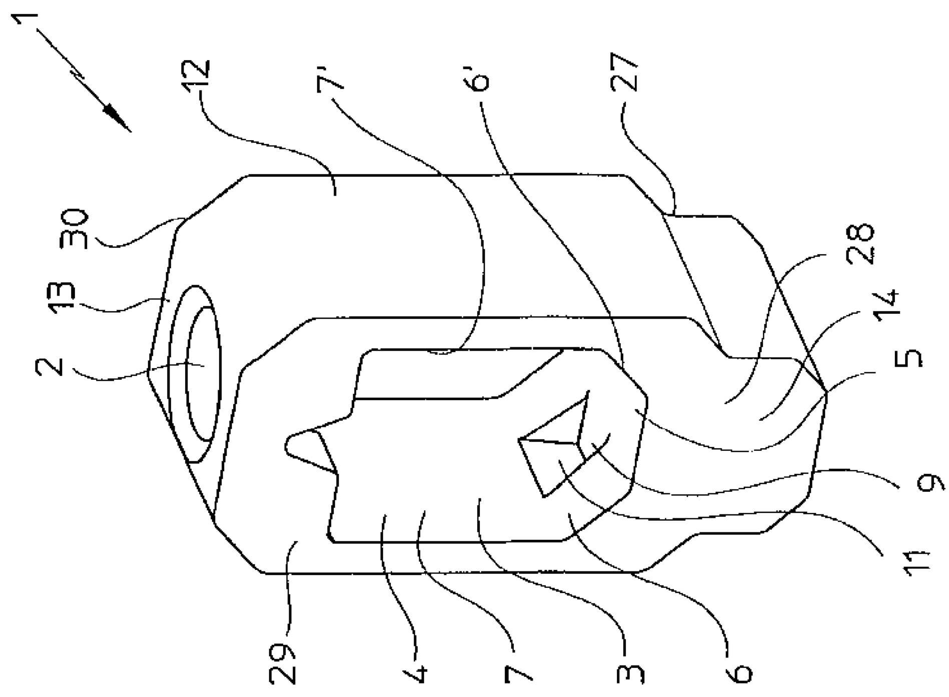
FIG. 4 a support surface textured using embossing equipment for electrical conductors with a recess.

A clamp body produced using the manufacturing procedure and device per FIG. 2 is shown in FIG. 4. In principle, the clamp body 1 consisting of a copper alloy is a geometric body consisting of four walls. Consisting of two perpendicular sidewalls 12, an upper wall 13 in which the aperture 2 is located for a clamp screw (not shown), and a floor wall 14 across from the upper wall 13 that extends perpendicular to the sidewalls 12. All walls are formed as one piece. The outer shape of the clamp body 1 may possess different thickness 28 and shape 27 in the floor area. A cavity 4 is located in the center of the clamp body 1 that is accessible from two sides through apertures 3 that are located on the front face 29 and the rear face 30, and is formed by inner surfaces. The cavity 4 serves to receive the electrical conductor (not shown), and possesses various support surfaces and contact surfaces to clamp and contact the electrical conductor. Two support surfaces 7, 7' extend parallel to the perpendicular sidewalls 12. The support surface of the floor 5 is perpendicular to the support surfaces of the sidewalls 7, 7'. Two additional oblique support surfaces 6, 6 are positioned between the floor surface 5 and the sidewall surfaces 7, 7' to increase the contact of the electrical conductor with the support surfaces of the cavity 4. The oblique support surfaces 6, 6' connect the floor surface 5 with the sidewall surfaces 7, 7' at an angle of approximately 45°. The oblique surface 6, 6' was textured using an embossing tool 16 to increase the clamping effect. The embossing stamp texture 17 of the embossing tool 16 creates a texture 9 in the oblique surface 6, 6'. This texture 9 is implemented, for example, as a recess 11, and is also known as a bead. The production of several beads 11 in an oblique surface 6, 6' is also conceivable.

Figure 6:
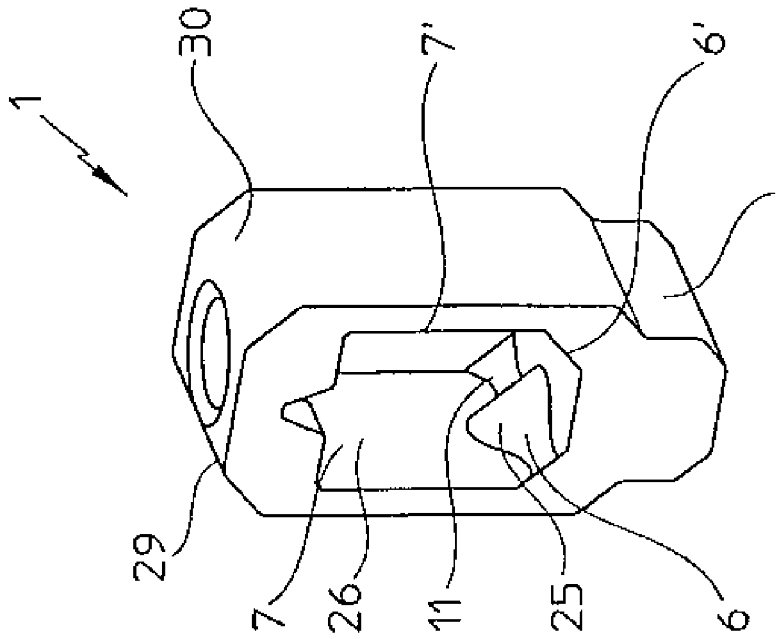
FIG. 6 a support surface textured using embossing equipment for electrical conductors with a recess and a raised projection.
Figure 5:
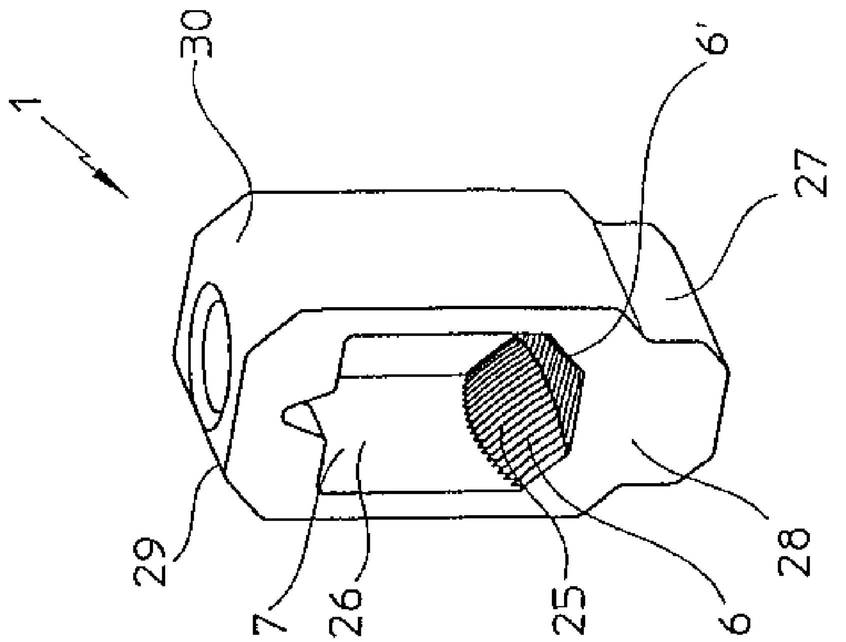
FIG. 5 a support surface textured using embossing equipment for electrical conductors with a raised projection.

The texture 17 of the embossing tool 16 may also create a raised projection in the oblique surface 6, 6' in the form of a crown-shaped projection 25 (see FIG. 5). Also, a combination of recesses 11 and crown-shaped projections 25 may be created as a texture 9 in the oblique surfaces 6, 6' for further increase of the clamping effect for electrical conductors, particularly in special applications. FIG. 6 shows this textured implementation form. An alternating series of crown-shaped projections and recesses 11 creates waved textures in the oblique surfaces 6, 6', whereby the material pressed into the recesses 11 may be used to raise the crown-shaped projections 25. The texturing of the sidewalls 7, 7', advantageously with micro-textures 26 is possible using embossing equipment, whereby the depth of the micro-texture may lie within the range of 1 micrometer to 0.1 millimeter. For this, the clamp body 1 requires merely that it be rotated through 90°, the embossing tool be guided into place, and textured as before using procedure described above, whereby the pressure spindle 19 is not guided through the aperture 2, but rather projects along the front face surface 29 of the clamp body 1 up to the embossing tool 16 that is projecting from the cavity 4.

The present invention is not intended to be limited to a device or method which must satisfy one or more of any stated or implied objects or features of the invention and should not be limited to the preferred, exemplary, or primary embodiment(s) described herein. Modifications and substitutions by one of ordinary skill in the art are considered to be within the scope of the present invention, which is not to be limited except by the allowed claims and their legal equivalents.

The invention claimed is:

1. A device to produce a metallic clamp body (1) for electro-technical screw terminal with a first aperture (2) to receive a clamp screw with a second aperture (3) configured to receive a electrical conductor said second aperture (3) including a cavity (4) formed by a plurality of inner surfaces (5, 6, 7, 8), wherein said cavity (4) is configured to receive said electrical conductor in contact with one or more of said plurality of inner surfaces (5, 6, 7), whereby one or more inner surfaces (5, 6, 7) of the cavity (4) of the second aperture (3) are textured, characterized in that an embossing tool (16) is used for the texturing (9), and wherein the embossing tool (16) possesses a texture (17) that creates a micro-texture (26) in at least one of the sidewall surfaces (7, 7') of the clamp body (1).

2. A procedure to form a texture on at least one inner surface of the walls of a metallic clamp body formed as one piece about a cavity for a screw terminal, whereby a first aperture for the clamp screw is present in one of the clamp body walls and two apertures are present on the face side of the clamp body, of which at least one serves as conductor-insertion aperture, characterized in that a embossing tool is inserted through one of the apertures of the clamp body, and is loaded along the direction of the inner surface of the pertinent clamp body wall to be provided with a texture with a force required to create the texturing.

3. A procedure as in claim 2, characterized in that the embossing tool is inserted through the first aperture intended for the clamp screw into the clamp body cavity and is directly loaded with the force required for the texturing.

4. A procedure as in claim 2, characterized in that the embossing tool is inserted through one of the face-side apertures in the cavity of the clamp body, and is loaded with the force required for the texturing in the pertinent clamp body wall by means of the pressure spindle inserted through the first aperture for the clamp screw.

* * * * *